United States Patent [19]

Schmidt et al.

[11] Patent Number: 5,014,001
[45] Date of Patent: May 7, 1991

[54] TEST PROBE MANIPULATOR FOR WAFER-PROBING APPARATUS

[75] Inventors: Hans Schmidt, Auggen; Helmut Günter, Freiburg-Munzingen, both of Fed. Rep. of Germany

[73] Assignee: Deutsche ITT Industries GmbH, Freiburg, Fed. Rep. of Germany

[21] Appl. No.: 522,717

[22] Filed: May 14, 1990

[30] Foreign Application Priority Data

Jun. 10, 1989 [EP] European Pat. Off. ........ 89110553.8

[51] Int. Cl.$^5$ .......................... G01R 31/02; G01R 7/28
[52] U.S. Cl. ............................... 324/158 F; 324/158 P; 33/543
[58] Field of Search ................. 324/158 F, 158 P, 725; 33/1 M, 556, 559, 572, 557, 645, 533, 543

[56] References Cited

U.S. PATENT DOCUMENTS

| 3,333,274 | 7/1967 | Forcier | 346/33 |
|---|---|---|---|
| 3,648,169 | 3/1972 | Wiesler | 324/158 F |
| 4,056,777 | 11/1977 | Roch | 324/158 F |
| 4,063,172 | 12/1977 | Faure et al. | 324/158 F |
| 4,167,066 | 9/1979 | Cooper et al. | 33/543 |
| 4,565,966 | 1/1986 | Burr et al. | 324/158 F |
| 4,746,857 | 5/1988 | Sakai | 324/158 F |
| 4,751,457 | 6/1988 | Veenendaal | 324/158 F |
| 4,901,446 | 2/1990 | Narishige | 33/572 |

FOREIGN PATENT DOCUMENTS

0118338  9/1984  European Pat. Off. ............. 33/556

OTHER PUBLICATIONS

IBM Technical Disclosure Bulletin, vol. 20, No. 9, Feb. 1978, pp. 3461-3462; L. H. Faure, et al.: "Testing Apparatus with Selectable Probes and Contractors for Use with Changable Patterns".

IBM Technical Disclosure Bulletin, vol. 13, No. 7, Dec. 1970, pp. 2113-2114; J. W. Wagner, et al.: "Orbiting Probe".

Primary Examiner—Reinhard J. Eisenzopf
Assistant Examiner—Vinh P. Nguyen
Attorney, Agent, or Firm—Thomas L. Peterson

[57] ABSTRACT

The test-probe manipulator for a test probe for use with semiconductor wafers utilizes three adjusting spindles (50,51,52) arranged on the same side of the manipulator. The test-probe manipulator occupies little space and is easy to operate. All three axes of translational freedom perform linear motions independent of each other. Accuracy of adjustment is improved as compared to conventional devices. Easy placement on and removal from a test platform are ensured.

19 Claims, 3 Drawing Sheets

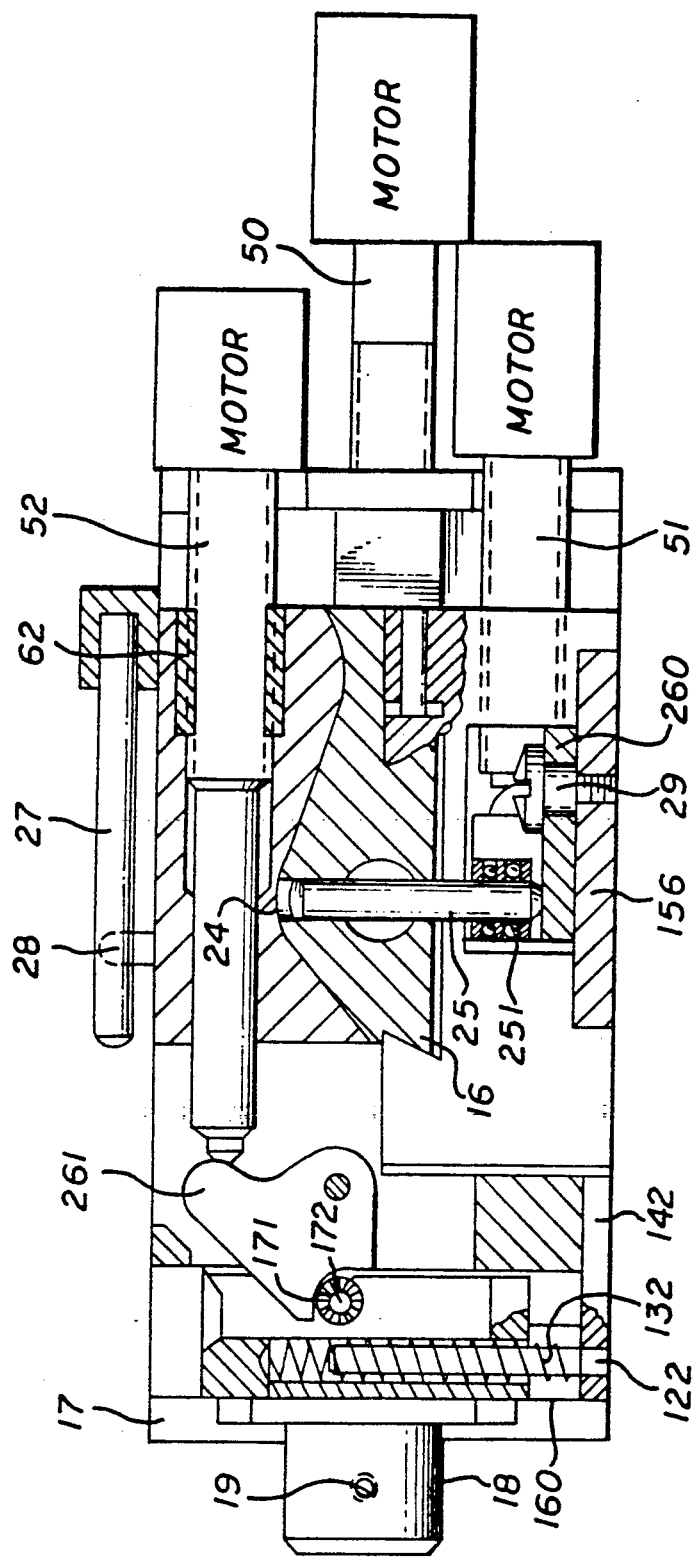

TEST PROBE MANIPULATOR FOR WAFER-PROBING APPARATUS

Background of the Invention

1. Field of the Invention

The present invention relates to a test-probe manipulator for wafer-probing apparatus.

2. Description of the Prior Art

In semiconductor technology, the parameters of the devices on a wafer are determined with test probes, each of which is connected via a suitable holder with a manipulator. The probe is placed on the test points with the aid of adjusting spindles provided at different sides of the manipulator in the axial X, Y, and Z positions.

In commercially available devices, the individual axes are frequently not completely independent of each other for design reasons. If, for example, the corresponding adjusting spindle is adjusted in the direction of the X-axis, the test probe will also move with a micro-displacement in the direction of the Y- or Z-axis. In addition, in many devices, the test probe describes an arc during adjustment, which is a considerable disadvantage with the extremely fine geometries now in use. Furthermore, the arrangement of the adjusting spindles at three different sides of the probing apparatus results in a greater space requirement and complicates the operation of the manipulator if several manipulators are arranged side by side.

It is the object of the invention as claimed to provide a test-probe manipulator which occupies less space, is easier to operate, and operates more accurately than the prior art devices.

The invention will now be explained in greater detail with reference to an embodiment thereof shown in the accompanying drawings, in which:

BRIEF SUMMARY OF THE INVENTION

The invention is a test-probe manipulator for use with wafer probing apparatus for performing independent translations of the apparatus along an X. Y. and Z axis. The invention comprises a base, and a compound rest attached to the base. The compound rest is movable in the direction of the X-axis. A hole is defined in the compound rest and has two end portions and a center portion. The diameter of the center portion of the hole is less than that of the two end portions. One portion has a spring bearing surface. A groove is defined in the compound rest. A vertical slide is moveably connected with the base. A cross slide has a groove defined therein and has two spaced apart holes arranged one above the other in the direction of the Z-axis. The vertical slide supports the cross slide. A receptacle holder for the test-probe is attached to the cross slide. First. second. and third adjusting spindles are arranged at on a selected narrow side of the manipulator and extend parallel to each other in the direction of the X-axis. A spindle nut receives the first adjustment spindle (50) A nut holder is attached to the spindle nut. The spindle nut extends into end portion of the hole in compound rest. A contact ball is disposed in the hole. A thrust bolt is provided. The first adjustment spindle acts via the thrust bolt on a contact ball which is fixed at the end of the central portion of the hole directed toward the thrust bolt. A first pin holder is coupled to the base. A spring-guiding pin is mounted at one end in first pin holder attached to the base and extends into the hole. A compression spring is telescopically supported by the spring-guiding pin. The spring rests both against the first pin holder and against spring-bearing surface formed by the enlargement of the diameter of the hole toward the first pin holder.

A spindle nut is fitted in the compound rest for receiving second adjusting spindle. A contact ball is provided. A thrust bolt acts on the contact ball. A first follower is pivoted to a cover plate. The contact ball is fixed at the first follower. A ball bearing is contacted by the first follower. A driving pin is acted upon by ball bearing attached to the vertical slide and is movable in a groove of the compound rest. A compression spring is in contact with vertical slide. A spring-guiding pin is provided for telescopically guiding the compression spring. A second pin holder rests against the compression spring on the one hand and against the driving pin on the other.

A spindle nut receives the third adjustment spindle in vertical slide. A second follower is acted upon by third adjustment spindle and is pivoted to the vertical slide. A ball bearing is acted upon by third adjustment spindle and fixed in the groove of the cross slide. A third pin holder is attached to the vertical slide. A spring-guiding pin has one end fixed in third pin holder. A compression spring is disposed in each of the two spaced apart holes and is telescopically disposed around the corresponding spring-guiding pin which has one end fixed in third pin holder.

The test-probe manipulator is characterized in that the base comprises at least two holding magnets, two ball bearings, and an eccentric shaft rotatably mounted by means of the two ball bearings. The adjusting spindles are operated manually or by means of a motor 7. The compound rest, vertical slide, and cross slide are interconnected via dovetail guides.

In one embodiment the test-probe manipulator is attached to a test platform by vacuum.

The invention can better be visualized by now turning to the following drawings wherein like elements are reference by like numerals.

BRIEF DESCRIPTION OF THE DRAWINGS

FIG. 4 is a section of another embodiment taken along line A—A' of FIG. 1 wherein the manual drive of the spindle has been replaced by a motor drive. The invention may be better understood by turning to the following detailed description.

DETAILED DESCRIPTION OF THE PREFERRED EMBODIMENTS

The test-probe manipulator for a test probe for use with semiconductor wafers utilizes three adjusting spindles (50,51, and 52) arranged on the same side of the manipulator. The test-probe manipulator occupies little space and is easy to operate. All three axes of translational freedom perform linear motions independent of each other. Accuracy of adjustment is improved as compared to conventional devices. Easy placement on and removal from a test platform 1, are ensured.

Figure 1:
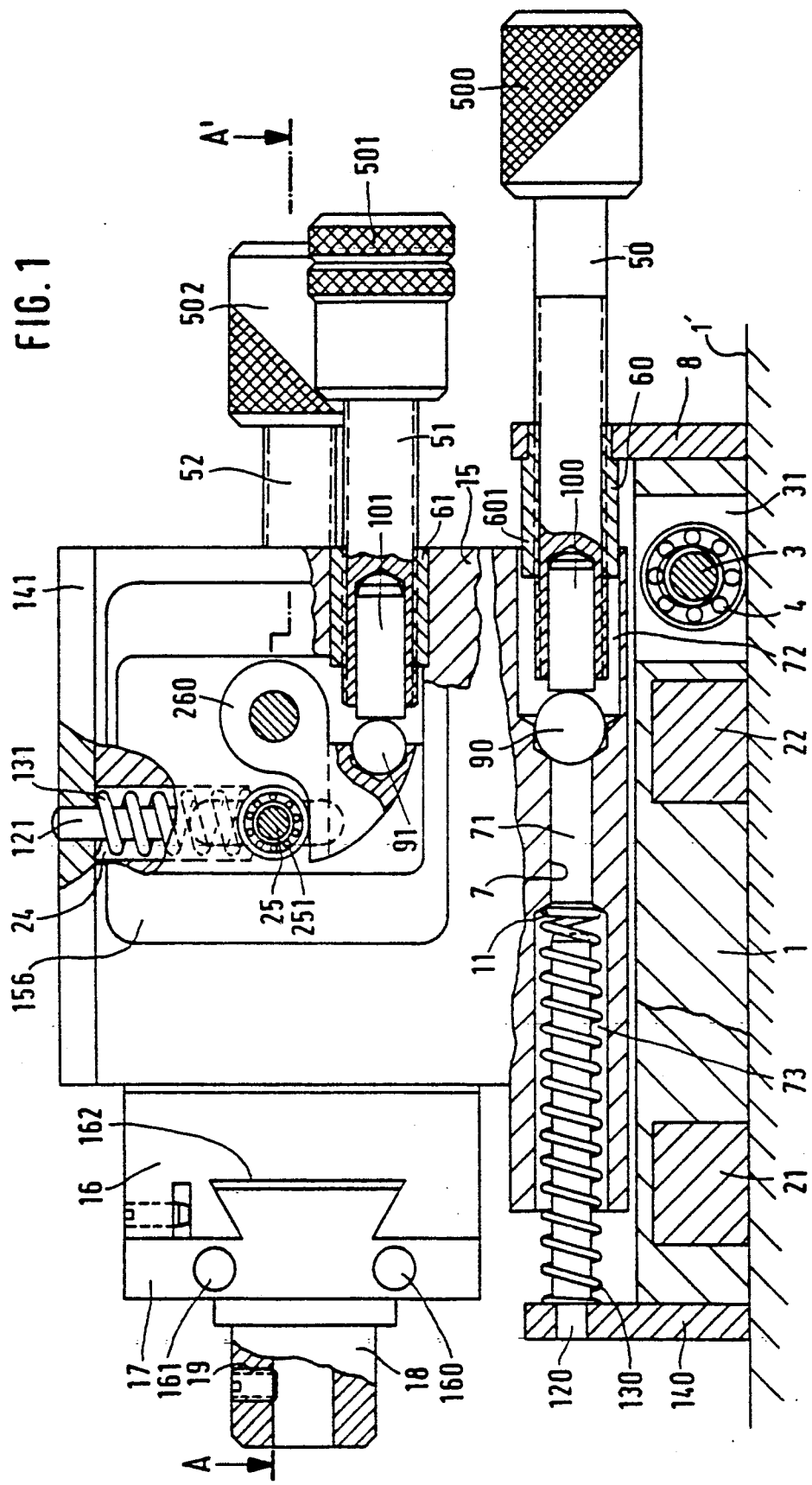
FIG. 1 is a side view, shown partly opened and in section, of the test-probe manipulator in accordance with the invention.

The side view of FIG. 1 is shown partly in section and cut away. On the bottom side of a base 1, at least two holding magnets 21, 22 are set flush for attaching the manipulator to a support e.g., a test platform 1. An eccentric shaft 3 is disposed in a hollow space 31 of the base 1 and provided with two ball bearings 4. An eccentric release lever 27 shown in FIG. 3 serves to detach the manipulator from the support.

Attached to one narrow side of the base 1 is a nut holder 8, which holds on end of a spindle nut 60, whose free end 601 extends into an enlarged end 72 of a hole 7 in a compound rest 15, which is connected with the base 1 via an adjustable dovetail guide. A first adjusting spindle 50 is inserted in spindle nut 60. At its end remote from the turning knob 500, spindle 50 carries a hardened thrust bolt 100, which rests against a contact ball 90, which is fixed at the narrowed center portion 71 of the hole 7. Attached to the other narrow side of the base 1 is a holder 140 in which one end of a spring-guiding pin 120 is fixed. The spring-guiding pin 120 extends into a second enlarged end portion 73 of the hole 7, said second end portion being directed toward the holder 140.

The spring-guiding pin has a compression spring 130 slipped thereon which extends between holder 140 and a spring-bearing surface 11 at the transition from narrowed center portion 71, which is slightly greater in diameter than that of the spring-guiding pin 120, so that, when the adjusting spindle 50 is rotated, spring-guiding pin 120 can slide into and out of center portion 71 if the compound rest 15 is moved forward or backward on the X-axis during operation of the manipulator.

A second adjusting spindle 51 is screwed in a second spindle nut 61 fitted in the compound rest 15. The end of spindle 51 remote from the turning knob 501 is provided with a hardened thrust bolt 101. Clockwise rotation of adjusting spindle 51 causes bolt 101 to exert pressure on a contact ball 91 which is fixed at a follower 260 pivotally mounted in the cover plate 156. The pivoted follower 260 is in contact with the ball bearing 251, which is mounted on a driving pin 25 fixed at a vertical slide 16. Driving pin 25 is movable in a groove 24 of the compound rest 15 and is acted on by a compression spring 131 which has been slipped over a spring-guiding pin 121 mounted in and is supported by a pin holder 141.

Through the above-described cooperation of the parts, a vertical slide 16 is moved upward against the pressure of spring 131. Counterclockwise rotation of adjusting spindle 51 causes compression spring 131 to force vertical slide 16 downward.

This vertical slide 16 is slideably connected with compound rest 15 via an adjustable dovetail guide. It carries the cross slide 17, which is also movable via an adjustable dovetail guide and has a receptacle 18 for the test-probe holder attached to its front. The test-probe holder is fixed, for example, by means of a screw screwed into the threaded hole 19. A pin holder 142, seen in FIG. 2, attached to the longer side of the vertical slide 16 has been removed, so that both the adjustable dovetail guide 162 in vertical slide 16 and the holes 160, 161 in the cross side 17 can be seen.

Figure 2:
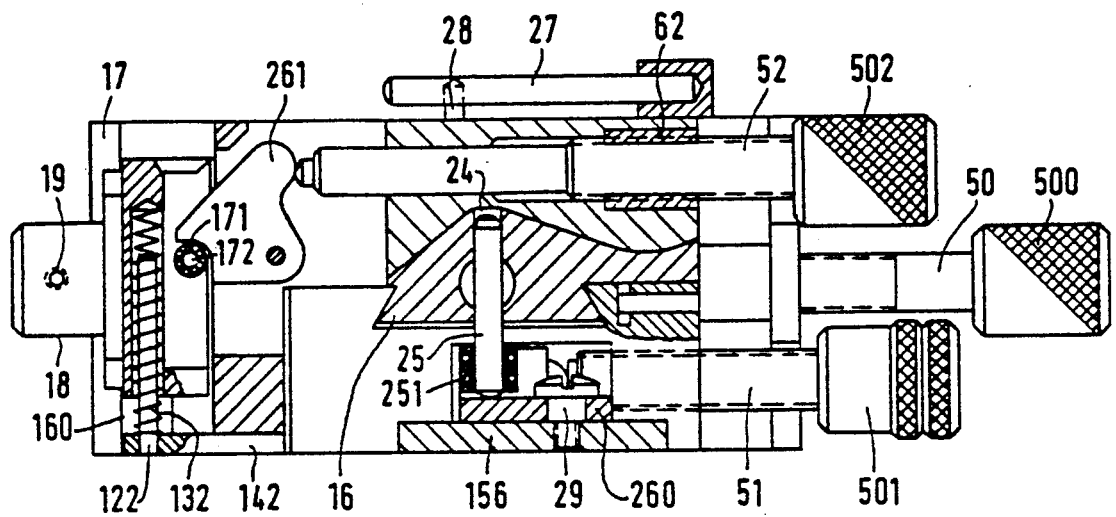
FIG. 2 is a section taken along line A—A' of FIG. 1.

FIG. 2 is a top sectional view taken along line A—A' of FIG. 1. It shows release lever 27, which is secured to the eccentric shaft 3, resting against the stop pin 28, and serving to detach the manipulator from the test platform. The cross section also illustrates again the positions of the adjusting spindles 50, 51, and 52 relative to each other. It can also be seen how the follower 260 is pivoted to the cover plate 156 via the pivot screw 29.

Driving pin 25, fixed at one end in the vertical slide 16 and inserted into the ball bearing 251, is movable in the groove 24.

FIG. 2 further shows that the third adjusting spindle 52 with a turning knob 502 acting via a spindle nut 62 on the second follower 261, which is pivoted to the vertical slide 16. The pivoted follower 261 acts on a ball bearing 171 fastened in a groove of the cross slide 17 by means of a straight pin 172.

Clockwise rotation of the adjusting spindle 52 as viewed from the the right of FIG. 2 causes the cross slide 17 to be moved to the left against the spring force. Counterclockwise rotation of the adjusting spindle 52 as viewed from the right of FIG. 2 allows springs 132 to force cross slide 17 to the right.

As mentioned in connection with FIG. 1, cross slide 17 has two holes 160 and 161, each of which contains a compression spring 132,133. These springs rest against the end of the respective hole on the one hand and pin holder 142 on the other. In pin holder 142, two-spring guiding pins 122 and 123 (both shown in FIG. 3) are fixed at on end, the cross-sectional view of FIG. 2 showing only the compression spring 132 and the spring-guiding pin 122. Attached to cross slide 17 is receptacle 18 with the threaded hole 19 for a clamping screw for fixing the test-probe holder in position.

Figure 3:
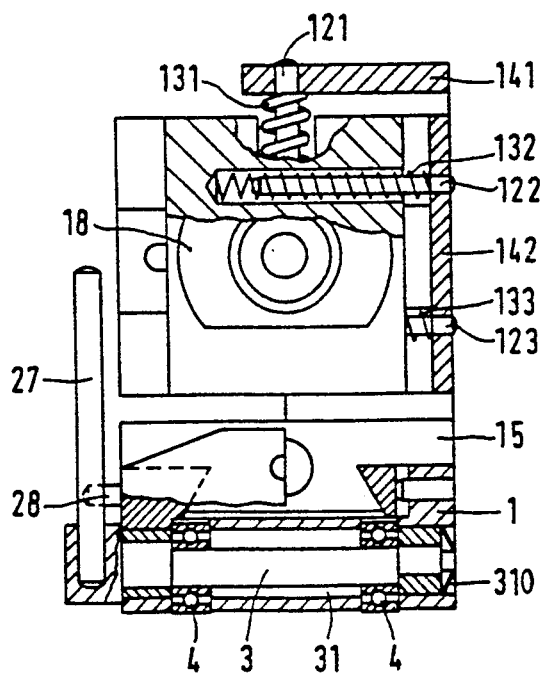
FIG. 3 is a front view of one narrow side of the test-probe manipulator with the receptacle for the test-probe holder.

FIG. 3 is a view of the left-hand narrow side of the embodiment of the invention shown in FIG. 1. One can see the receptacle 18 for the test-probe holder and release lever 27 for separating separated the manipulator from the test platform. Release lever 27 is secured to eccentric shaft 3, which exerts pressure via ball bearing 4 on the support or test platform during detachment. Eccentric shaft 3 is fixed to base 1 via a clamping plate 310 at its end remote from the release lever.

FIG. 3 further shows holes 160, and 161 containing the spring-guiding pins 122, 123 and the springs 132, 133.

FIG. 3 again illustrates how spring-guiding pin 121 is mounted in the pin holder 141 and how the spring 131 rests against this holder.

In the embodiment described, the manipulator is attached to a support by means of two or three magnets. Attachment by vacuum is also possible. To this end, holes have to be made in the base which communicate with a central hole at which a vacuum can be applied in the known manner. Via a suitable valve, the vacuum can be switched to compressed air, so that the manipulator will float on the support and can be easily lifted.

The advantages of the invention lie in the solution of the problem itself, namely to implement a test-probe manipulator which occupies little space and is easy to operate, and in the fact that all three axes perform linear motions independent of each other. In addition, adjustment accuracy is improved as compared to conventional devices, and easy placement on and removal from the test platform are ensured.

I claim:

1. A test-probe manipulator for use with wafer probing apparatus for performing independent translations of said apparatus along X, Y, and Z axes, comprising:
   a base (1);
   a compound rest (15) attached to said base and movable in the direction of the X-axis, a hole (7) defined in said compound rest and having two end portions (72 and 73) and a center portion (71), the diameter of the center portion of the hole being less than that of the two end portions, portion (73) having a spring bearing surface (11), a groove (24) being defined in compound rest (15);

a vertical slide (16), said base moveably connected with said vertical slide;

a cross slide (17) having a groove defined therein and having two spaced apart holes (160,161) arranged one above the other in the direction of the Z-axis, said vertical slide supporting said cross slide (17);

a receptacle (18) for test-probe holders attached to said cross slide;

first, second, and third adjusting spindles (50,51,52) arranged at on a selected narrow side of the manipulator and extending parallel to each other in the direction of the X-axis;

a spindle nut (60) for receiving said first adjusting spindle (50);

a nut holder (8) attached to said spindle nut, said spindle nut extending into end portion (72) of hole (7) in compound rest (15);

a contact ball (90) disposed in hole (7);

a thrust bolt (100), adjusting spindle (50) acting via thrust bolt (100) on a contact ball (90) which is fixed at the end of the central portion (71) of the hole (7) directed toward the thrust bolt (100);

a first pin holder (140) coupled to base (1);

a spring-guiding pin (120) mounted at one end in first pin holder (140) attached to the base (1) extending into hole (7);

a compression spring (130) telescopically supported by spring-guiding pin (120), spring (130) resting both against first pin holder (140) and against spring-bearing surface (11) formed by the enlargement of the diameter of the hole (7) toward the first pin holder (140);

a spindle nut (61) fitted in the compound rest (15) for receiving second adjusting spindle (51);

a contact ball (91);

a thrust bolt (101) acting on a contact ball (91);

a first follower (260) which is pivoted to a cover plate, said contact ball (91) fixed at said first follower (260);

a ball bearing (251) contacted by said first follower (260);

a driving pin (25) acted upon by ball bearing (251) attached to vertical slide (16) and movable in a groove (24) of the compound rest (15);

a compression spring (131) in contact with vertical slide (16);

a spring-guiding pin (121) for telescopically guiding compression spring (131);

a second pin holder (141) resting against compression spring (131) on the one hand and against driving pin (25) on the other;

a spindle nut (62) for receiving third adjusting spindle (52) in vertical slide (16);

a second follower (261) acted upon by third adjusting spindle (52) and pivoted to vertical slide (16);

a ball bearing (171) acted upon by third adjusting spindle and fixed in said groove of cross slide (17);

a third pin holder (142) attached to the vertical slide (16);

a spring-guiding pin (122, 123) having one end fixed in third pin holder (142); and a compression spring (132,133) disposed in each of said two spaced apart holes (160,161) and telescopically disposed around spring-guiding pin (122,123) which has one end fixed in third pin holder (142).

2. The test-probe manipulator of claim 1, characterized in that the base (1) comprises:
at least two holding magnets (21, 22);
two ball bearings (4); and
an eccentric shaft (3) rotatably mounted by means of said two ball bearings (4).

3. The test-probe manipulator of claim 2, characterized in that the adjusting spindles are operated manually.

4. The test-probe manipulator of claim 2, further comprising a motor and characterized in that the adjusting spindles are operated by means of a motor.

5. The test-probe manipulator of claim 1, characterized in that the adjusting spindles are operated manually.

6. The test-probe manipulator of claim 5, characterized in that said test probe manipulator is attached to a test platform by vacuum.

7. The test-probe manipulator of claim 1, further comprising a motor and characterized in that the adjusting spindles are operated by means of a motor.

8. The test-probe manipulator of claim 1, characterized in that compound rest (15), vertical slide (16), and cross slide (17) are interconnected via dovetail guides.

9. The test-probe manipulator of claim 8, characterized in that said test probe manipulator is attached to a test platform by vacuum.

10. The test-probe manipulator of claim 1 characterized in that said test probe manipulator is attached to a test platform by vacuum.

11. A test-probe manipulator for use with wafer probing apparatus for performing independent translations of said apparatus along X, Y, and Z axes, comprising:

a base (1);

a compound rest (15) attached to said base, said compound rest movable in the direction of the X-axis;

a vertical slide (16), said base moveably connected with said vertical slide;

a cross slide (17), said vertical slide supporting said cross slide (17);

a receptacle (18) for test-probe holders attached to said cross slide;

first, second, and third adjusting spindles (50,51,52) arranged at on a selected side of the manipulator and extending parallel to each other in the direction of the X-axis; and corresponding first, second and third means for moving said compound rest, cross slide and vertical slide independently along said X, Y, and Z axes respectively, said means being driven by said corresponding first, second and third adjusting spindles.

12. The test-probe manipulator of claim 11 wherein said first means comprises:

wherein said compound rest (15) has a hole (7) defined in said compound rest and two end portions (72 and 73) and a center portion (71), the diameter of the center portion of the hole being less than that of the two end portions, portion (73) having a spring bearing surface (11), a groove (24) being defined in compound rest (15);

a spindle nut (60) for receiving said first adjusting spindle (50);

a nut holder (8) attached to said spindle nut, said spindle nut extending into end portion (72) of hole (7) in compound rest (15);

a contact ball (90) disposed in hole (7);

a thrust bolt (100), adjusting spindle (50) acting via thrust bolt (100) on a contact ball (90) which is fixed at the end of the central portion (71) of the hole (7) directed toward the thrust bolt (100);

a first pin holder (140) coupled to base (1);

a spring-guiding pin (120) mounted at one end in first pin holder (140) attached to the base (1) extending into hole (7); and a compression spring (130) telescopically supported by spring-guiding pin (120), spring (130) resting both against first pin holder (140) and against spring-bearing surface (11) formed by the enlargement of the diameter of the hole (7) toward the first pin holder (140).

13. The test-probe manipulator of claim 11 wherein said second means comprises:

a spindle nut (61) fitted in the compound rest (15) for receiving second adjusting spindle (51);

a contact ball (91);

a thrust bolt (101) acting on a contact ball (91);

a first follower (260) which is pivoted to a cover plate, said contact ball (91) fixed at said first follower (260);

a ball bearing (251) contacted by said first follower (260);

a driving pin (25) acted upon by ball bearing (251) attached to vertical slide (16) and movable in a groove (24) of the compound rest (15);

a compression spring (131) in contact with vertical slide (16);

a spring-guiding pin (121) for telescopically guiding compression spring (131); and a second pin holder (141) resting against compression spring (131) on the one hand and against driving pin (25) on the other.

14. The test-probe manipulator of claim 11 wherein said third means comprises:

a spindle nut (62) for receiving third adjusting spindle (52) in vertical slide (16);

a second follower (261) acted upon by third adjusting spindle (52) and pivoted to vertical slide (16);

wherein said cross slide has a groove defined therein;

a ball bearing (171) acted upon by third adjusting spindle and fixed in said groove of cross slide (17);

a third pin holder (142) attached to the vertical slide (16);

a spring-guiding pin (122, 123) having one end fixed in third pin holder (142); and a compression spring (132,133) disposed in each of said two spaced apart holes (160,161) and telescopically disposed around spring-guiding pin (122, 123) which has one end fixed in third pin holder (142).

15. The test-probe manipulator of claim 11, characterized in that the base (1) comprises:

at least two holding magnets (21,22);

two ball bearings (4); and an eccentric shaft (3) rotatably mounted by means of said two ball bearings (4).

16. The test-probe manipulator of claim 11, characterized in that the adjusting spindles are operated manually.

17. The test-probe manipulator of claim 11, further comprising a motor and characterized in that the adjusting spindles are operated by means of a motor.

18. The test-probe manipulator of claim 11, characterized in that compound rest (15), vertical slide (16), and cross slide (17) are interconnected via dovetail guides.

19. The test-probe manipulator of claim 11 characterized in that said test probe manipulator is attached to a test platform by vacuum.

* * * * *